(12) United States Patent
Rapisarda

(10) Patent No.: US 8,004,856 B2
(45) Date of Patent: Aug. 23, 2011

(54) SOLDER AND LEAD-FREE ELECTRONIC CIRCUIT AND METHOD OF MANUFACTURING SAME

(76) Inventor: Carmen Rapisarda, Apple Valley, CA (US)

( * ) Notice: Subject to any disclaimer, the term of this patent is extended or adjusted under 35 U.S.C. 154(b) by 0 days.

(21) Appl. No.: 12/711,200

(22) Filed: Feb. 23, 2010

(65) Prior Publication Data

US 2010/0208425 A1 Aug. 19, 2010

Related U.S. Application Data

(63) Continuation of application No. 11/432,466, filed on May 10, 2006, now abandoned.

(51) Int. Cl.
*H05K 1/11* (2006.01)
*H05K 1/14* (2006.01)
(52) U.S. Cl. .................. 361/792; 361/760; 174/260
(58) Field of Classification Search ............ 361/792, 361/760, 691–692; 174/260
See application file for complete search history.

(56) References Cited

U.S. PATENT DOCUMENTS

| | | | | |
|---|---|---|---|---|
| 4,758,927 A | * | 7/1988 | Berg | 361/761 |
| 5,881,453 A | * | 3/1999 | Avery et al. | 29/834 |
| 2001/0037565 A1 | * | 11/2001 | Prasad et al. | 29/832 |
| 2006/0107523 A1 | * | 5/2006 | Blossfeld et al. | 29/830 |

* cited by examiner

*Primary Examiner* — Yuriy Semenenko
*Assistant Examiner* — Andargie M Aychillhum
(74) *Attorney, Agent, or Firm* — Roy L. Anderson; Wagner, Anderson & Bright, P.C.

(57) ABSTRACT

An electronic circuit contains a circuit board with conducting tracks to which one or more electronic components with conducting contacts are positioned overlying portions of the conducting tracks and each such electronic component is held in place by a clamp that covers and is contact with the top surface of the electronic components so as to hold their conducting contacts in electrical contact with the conducting tracks of the circuit board. The clamp can include a resilient layer held between the top surface of electronic components and a rigid clamping sheet.

17 Claims, 18 Drawing Sheets

SURFACE MOUNTED COMPONENT

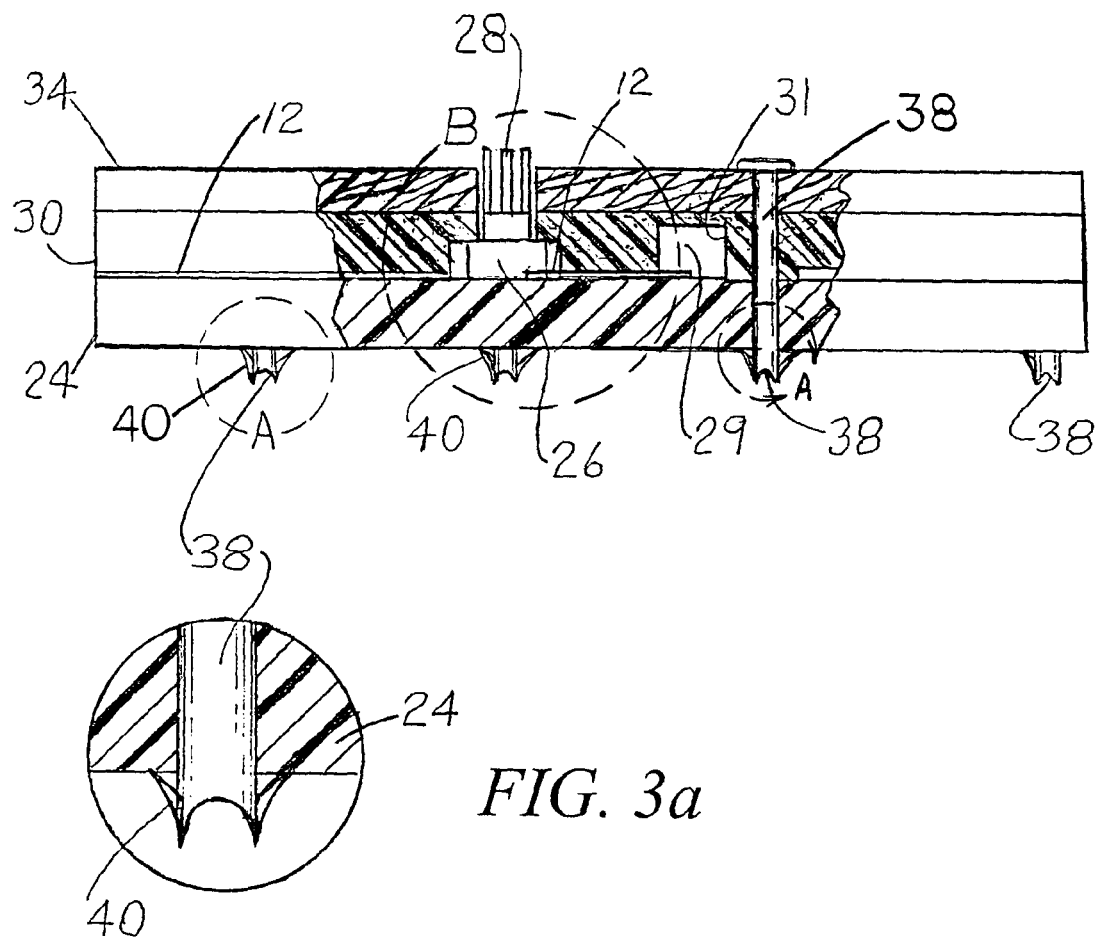
FIG. 3
FIG. 3a
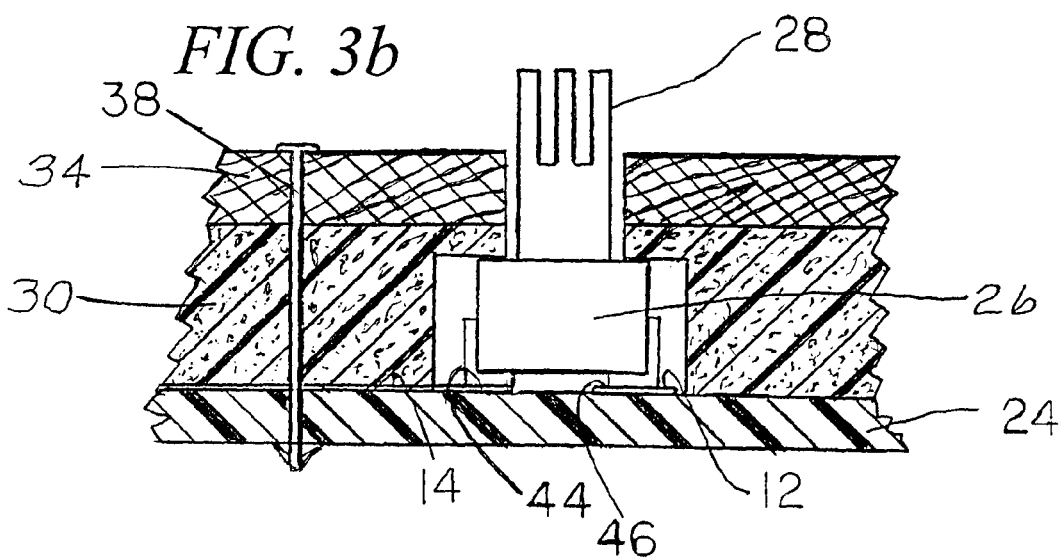
FIG. 3b

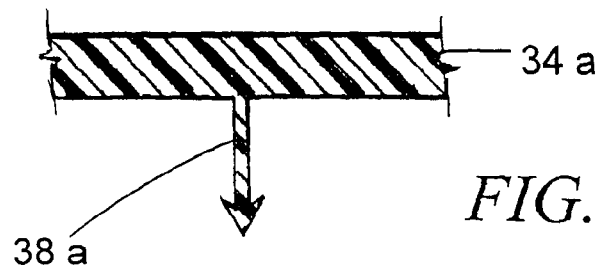
FIG. 3c
FIG. 4a
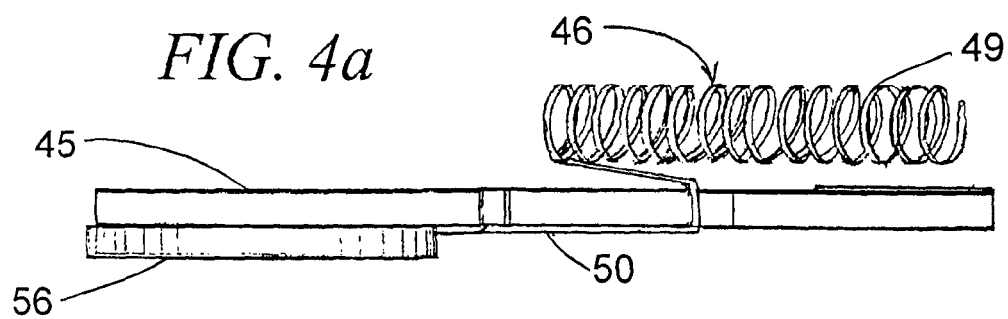
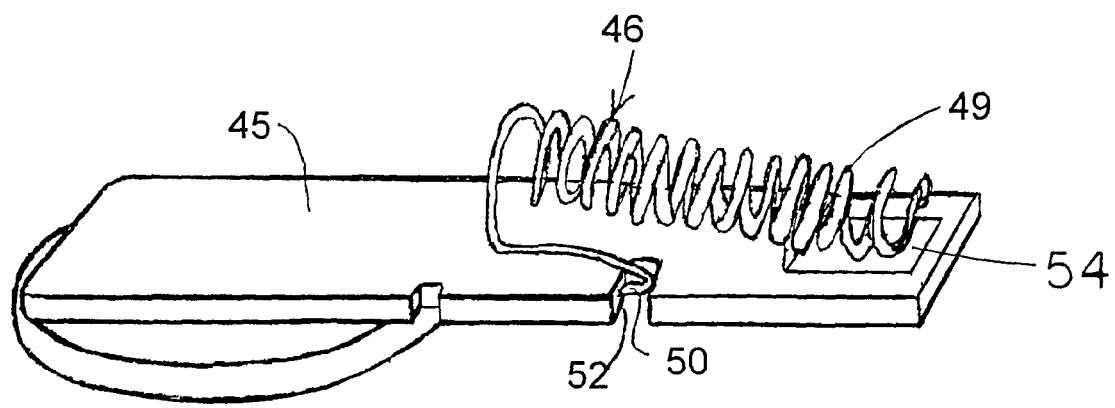
FIG. 4b

86d

86e

86f

86g

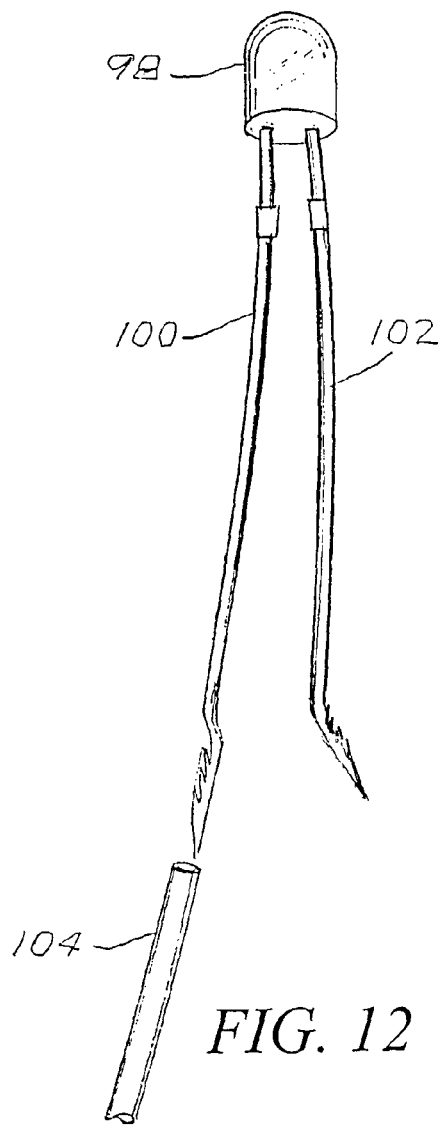
FIG. 12
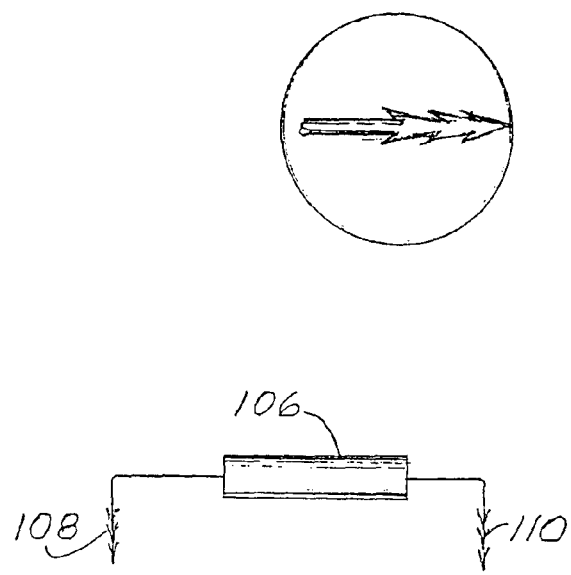
FIG. 14
FIG. 13
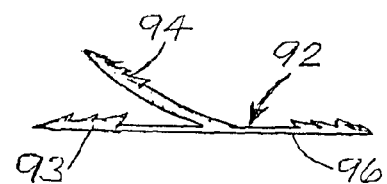
FIG. 11

Fig. 12b
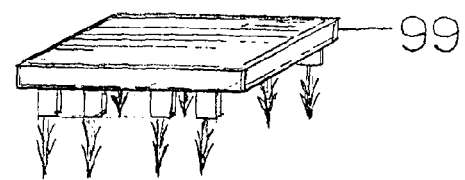
Fig. 12a
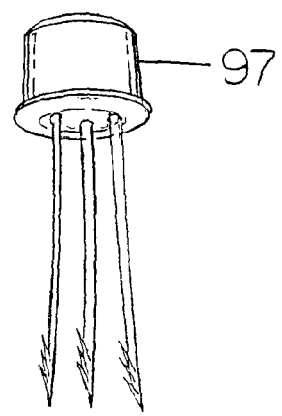
Fig. 12d
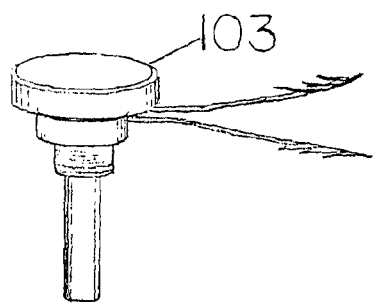
Fig. 12c
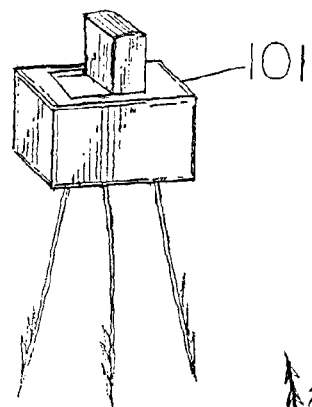
Fig. 12f
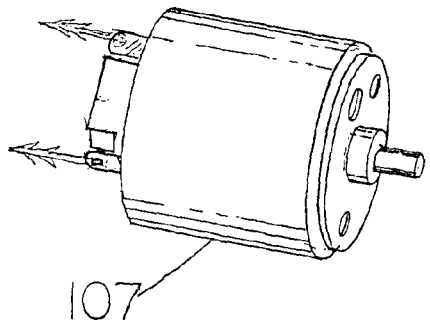
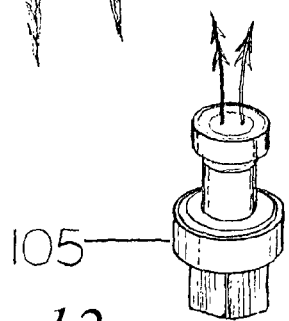
Fig. 12e

TO FIG. 20

SOLDER AND LEAD-FREE ELECTRONIC CIRCUIT AND METHOD OF MANUFACTURING SAME

REFERENCE TO RELATED APPLICATIONS

This is a continuation application of U.S. Ser. No. 11/432,466, filed May 10, 2006, now abandoned the disclosure of which is specifically incorporated herein by reference, which was an improvement upon the application Ser. No. 10/773,647 filed Feb. 6, 2004, the priority date of which is claimed.

BACKGROUND OF THE INVENTION

There has been a considerable effort to remove lead and other toxic materials from the environment, particularly from children's rooms and toys. In carrying out this effort, it is desirable to provide lighting circuits for shoes and other garments that are solder and lead (Pb) free. Circuits that are concealed in shoes are usually glued or cemented into the heels and are generally inaccessible; but as these shoes find their way into landfills, the toxic lead can possibly leach out, contaminating the environment.

There is also concern about solder joints in hand sets (cell phones) televisions, computers and related electronic gear, especially consumer items that may also find their way into landfills. Considerable work has been done in trying to eliminate solder and solder joints containing lead. Some have attempted to use tin (Sn) solder for solder joints, but it has been found that pure tin solder in small, fine circuits tends to grow projections called "dendrites", also called "tin whiskers", that cause circuit failure such as short circuits. This problem is cured with a small percentage of lead in the solder, but this is obviously an unsatisfactory solution.

My earlier effort in the application Ser. No. 10/773,647 was directed toward complete elimination of solder and included a lead (Pb) free circuit including a printed circuit board having conductor tracks on its surface with components having conductive pads contacting the conductive tracks. The components are covered with a layer of foam material, which, in turn, is covered by a clamping plate consisting of a sheet of hard material that is compressed against the foam to force the conductive pads of the surface mount components firmly against the conductor tracks. This assembly was screwed together by means of bolts and nuts. All or part of the described circuit may be covered with potting compound.

Impact or motion responsive switches are commonly associated with such electronic circuits or modules in clothing or footwear. Examples are illustrated by the following U.S. patents of this inventor:

| | |
|---|---|
| Re 37,220 | 5,692,324 |
| 6,238,056 | 5,649,755 |
| 6,017,128 | 5,366,780 |
| 5,732,486 | 5,285,586 |
| 5,704,706 | and 5,019,438 |

The circuit or module components are normally soldered in place and may be a source of lead contamination whenever the garments or footwear are discarded and find their way into waste disposal areas.

BRIEF SUMMARY OF THE INVENTION

It appeared to the applicant that the complete elimination of any solder would most effectively solve the above problems. Further development of the prior art circuit described above provided holes or ports through the foam layer and the clamping means such as a plate for providing clearance for components and ventilation to heat sinks on components.

Components, such as resistors or capacitors and surface mount components, may include conducting pads, which, under pressure from the foam layer or otherwise, make contact with conducting tracks on circuit boards. Other components may have leads that can be made sharp and formed with barbs (like the barbs of fishhooks). These leads can be forced into or adjacent to conductor tracks through drilled or drilled and through plated-ports to make electrical contact and are held by the barb securely with little danger of open circuits or of joints having excessive resistance. Wires and connectors can be formed with sharp points and barbs that can be pushed into insulated wires and will make a tight connection.

A clamping sheet or plate may be utilized to clamp the foam layer and components against the conductor tracks and may carry a number of barbed connecting pins which are pushed through the foam layer and holes in a circuit board, which may be a printed or other type circuit board, the barbs then catching on the lower side of the PCB/circuit board preventing the connecting pins from being withdrawn and acting as fasteners to hold the assembly together. The PCB/circuit board and components are thereby secured together and held by the force of the clamping board and by the resilient foam layer as it tries to return to its expanded size. The clamping means or layer and foam layer may be combined into one part.

To accommodate specifically shaped components or those requiring a heat sink and radiating fins the foam insulating layer or other resilient layer and the clamping plate may be cut out:

a) to provide recessed volumes to conform to the exterior shape of individual components, b) to provide confined precise space for such components, c) to allow automated or robotic assembly, and d) to permit heat sinks to be exposed to the air.

Such components are fastened and electrically connected to the PCB/circuit board by the pressure of the clamping plate and the resilient foam layer with means such as clips or screws. The recessed volume for components having heat sinks should be enough smaller than the components so that the components are held in place by the foam layer.

The applicant has devised an impact responsive switch which works in combination with a PCB/circuit board to operate reliably and avoid the use of any solder joints whatsoever, or other toxic material, especially lead solder joints.

This switch consists of a metal small unitary helical coil spring that includes at one end of the coil an integral clamp fashioned from the proximal end of the coil spring that self-clamps over an edge of the circuit board. It may clamp against a conductor track or against an insulated part of the board. The opposite or distal end of the coil (in the preferred embodiment, actually the entire coil) is subject to vibration from any forces acting on the switch thus the unrestrained end may move against a conductor track on the board to close a circuit with each input or vibration. Provision is also made for enclosing such switches for free movement without interference by potting resin or any of the assembly structure.

The entire circuits without any solder may also be protected by conformal coating, enclosures or molded encasements rendering them watertight and not readily subject to physical damage. If the end products of this invention ultimately reach landfills, they do not run the risk of soil or water table contamination by solder components or solder process chemicals.

In another embodiment of this invention, an electronic circuit may include a PCB/circuit board, a number of electronic components clamped to conductor tracks on the circuit board by means of a formed plastic overlay sealed to the circuit board or clamped in place by means of a clamping board. One version of this embodiment does not use the clamping board but incorporates a temperature responsive plastic sheet, which is sealed around the components and against the circuit board by vacuum sealing. In any case, this invention results in circuits or modules of reliable electrical and mechanical integrity while solder free.

A flow diagram is included in which a circuit incorporating the above-described invention is formed in an automated process.

DESCRIPTION OF THE DRAWINGS

This invention may be more clearly understood with the following detailed description and by reference to the drawings in which:

FIG. 3 is a side elevational view, partly in section, of the circuit of FIG. 2 as assembled;

FIG. 3a is an enlarged view of a circled part of FIG. 3;

FIG. 3b is an enlarged view of the portion B of FIG. 3 including a surface mount component and a heat sink;

FIG. 3c is a fragmentary view, partly in section, of an alternative form of clamping sheet and integral connecting pin;

FIG. 4a is a side elevational view of a circuit board, battery and switch combination;

FIG. 4b is a perspective view of the combination of FIG. 4a

FIG. 11 is a top plan view of a barbed multiple wire splice or connector according to the invention;

FIG. 12 is a perspective view of an LED with barbed and sharpened leads;

FIG. 12a is a side elevational drawing of a transistor having barbed and sharpened leads;

FIGS. 12b, 12c, 12d, 12e, and 12f are perspective drawings of an integrated circuit, a switch, a potentiometer, a transducer, and a motor, respectively, all having barbed and sharpened leads;

FIG. 13 is a side elevational view of an electrical component having leads, which are sharpened and barbed;

FIG. 14 is an enlarged view of a sharpened and barbed lead such as those shown in FIG. 13;

DETAILED DESCRIPTION OF THE INVENTION

Figure 1:
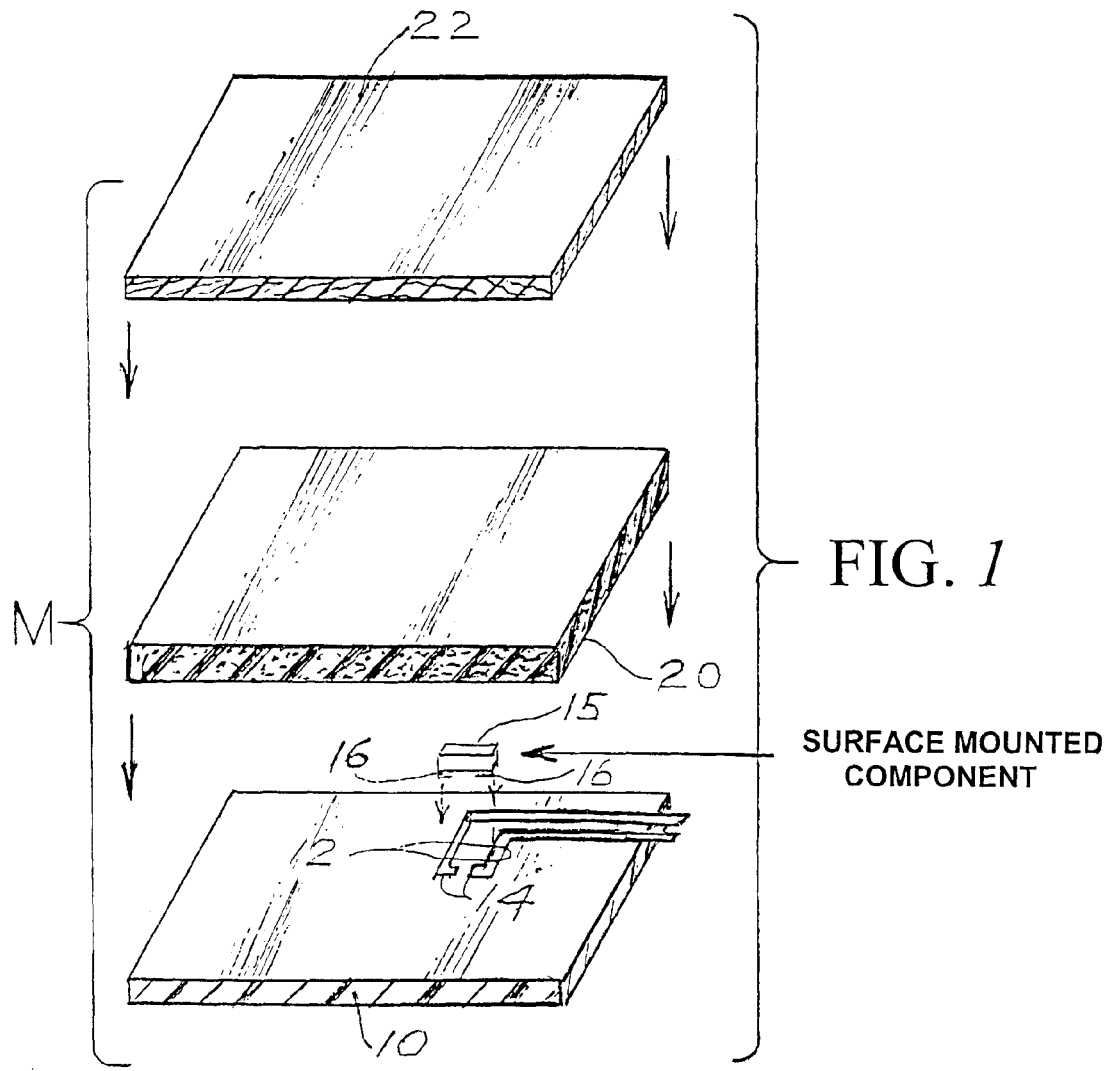
FIG. 1 is a simplified exploded perspective view of a solder and lead (Pb) free circuit with a surface-mounted component positioned to maintain in contact with conductive tracks by a compressed foam layer resilient foam layer.

Reference is now made to FIGS. 1-3c, in which, FIG. 1 is an exploded view of a simplified electronic circuit including a circuit or module generally designated M according to the invention, including a PCB/circuit board 10 having conductor tracks 12. Tracks 12 include conducting pads 14, which are contacted by conducting terminal pads 16 forming part of a surface-mounted component 15, which could be a resistor, a capacitor, or an integrated circuit.

Figure 2:
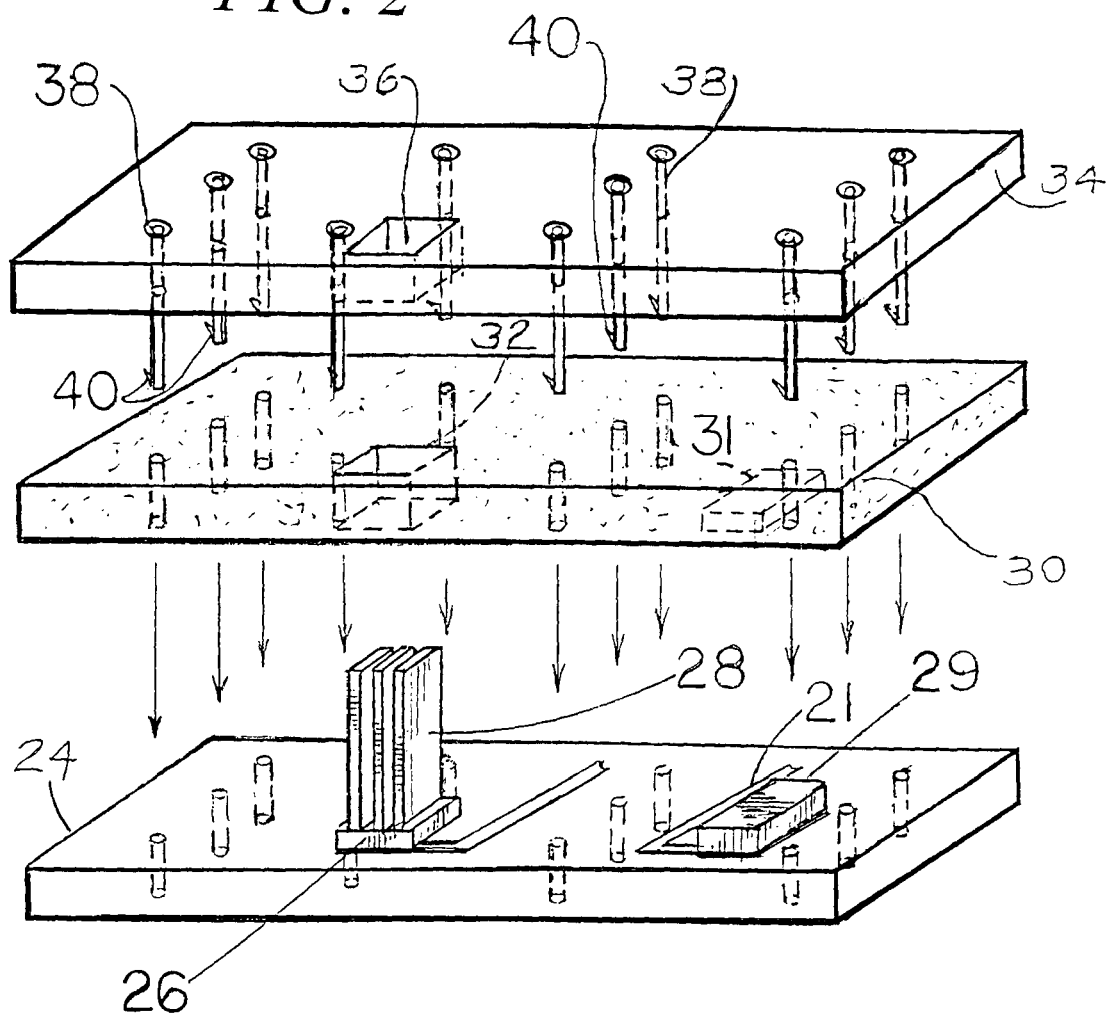
FIG. 2 is an exploded perspective view of an improved solder and lead (Pb) free circuit wherein the clamping sheet includes barbed connecting pins.

Positioned above PCB/circuit board 10 is a resilient foam insulating layer 20 that, when assembled, is pressed down against the top of PCB/circuit board 10 by a stiff clamping sheet 22, which may be of hard, non-conductive, composite material, such as Masonite® or fiberglass. The clamping sheet 22 is secured to the PCB/circuit board 10 by means of some form of fasteners such as bolts with nuts, as shown in FIG. 2, or barbed connecting pins (preferred) of FIGS. 2, 2c, 3-3c, and others and as discussed below. The fasteners hold the clamping board to the circuit board tightly holding all components mechanically and electrically to the circuit tracks.

Figure 1A:
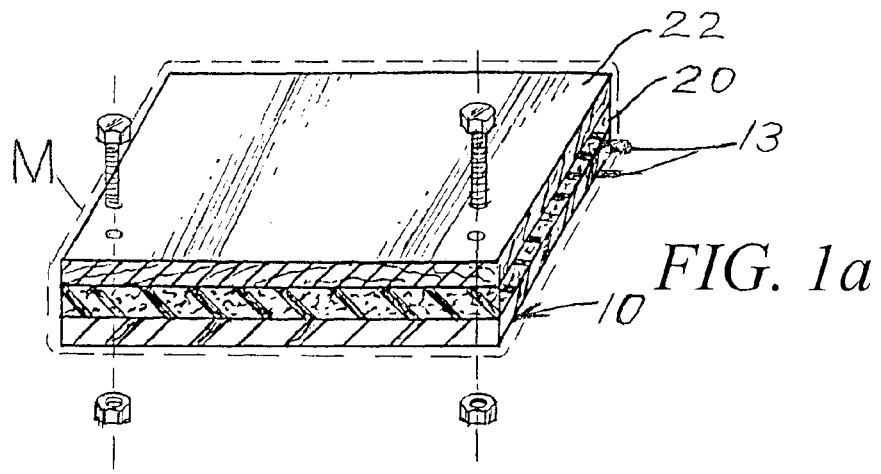
FIG. 1a is a perspective view of the assembled circuit of FIG. 1 with one form of fastener, a bolt and nut shown exploded.

Foam insulating layer 20 is preferably formed with properly located cavities, partial cavities, or cut-out areas such as those shown in FIG. 2 formed in the underside of foam pad 30 to avoid excessive pressure on components. These cavities also act as a means to align parts to their proper location on the PCB/circuit board. The assembly of FIG. 1 is shown in FIG. 1a with the layers stacked as described with electric access to the circuitry contained in the circuit or module M at the contacts or terminals 13 of the tracks 12.

For ease of comprehension, FIG. 1 is shown with a single component 15 and two printed circuit tracks 12. In real life, the circuit or module M may be crowded with appropriate components on many circuit traces, all electrically and mechanically secured as shown in FIGS. 1-3c.

FIG. 2 is an exploded perspective view of a stacked circuit similar to FIG. 1 but including additional features. PCB/circuit board 24 includes a surface-mounted component 26 with an attached heat sink 28 and a second surface-mounted component 29. Foam layer 30 includes a cut out 32, which permits heat sink 28 to protrude through into the surrounding air. Foam layer 30 also includes a formed cavity 31 that is aligned with and receives an additional surface mounted component 29. Clamping sheet 34 also has a cut out 36 aligned with foam layer cut out 32.

Clamping board or sheet 34 also is shown, including a plurality of preassembled, downwardly depending, connecting pins 38 having hooks or barbs 40 which, when the circuit of FIG. 2 is assembled, punch or pass through holes in foam layer 30 and pass through holes in the corresponding PCB/circuit board 24 and hook under the PCB/circuit board to hold the layers 24, 30, and 34 firmly together.

Figure 2A:
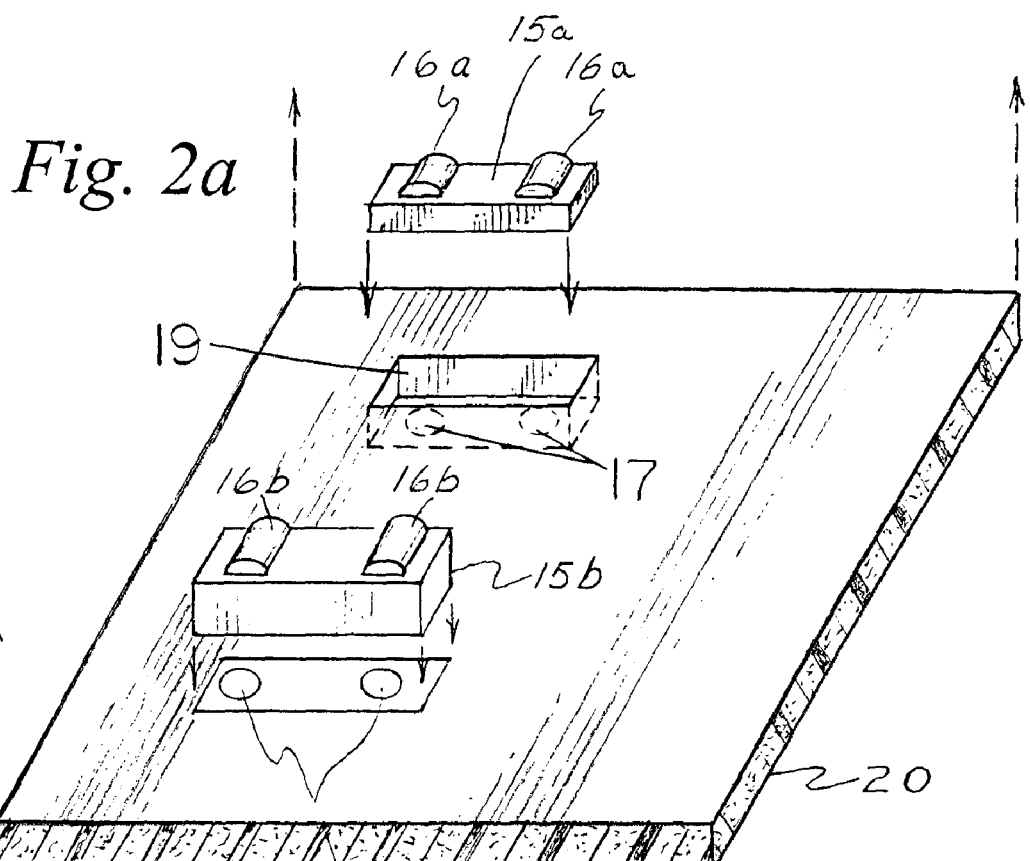
FIG. 2a is a perspective view of a shaped, resilient layer shown inverted with a cavity for receiving an electronic component and with adhesive areas for holding electronic components in position, both in the cavity and on its surface.

FIG. 2a is a perspective view of foam layer 20 of FIG. 1 shown inverted and with a cavity 19 for receiving a surface-mount component 15 having contacts 16a for making electrical contact with pads 14 in FIG. 1. Areas 17 of contact adhesive material secure components 15 and 15a to foam layer 20. Component 15a, being thinner than component 15, may require no cavity in layer 20.

Figure 2B:
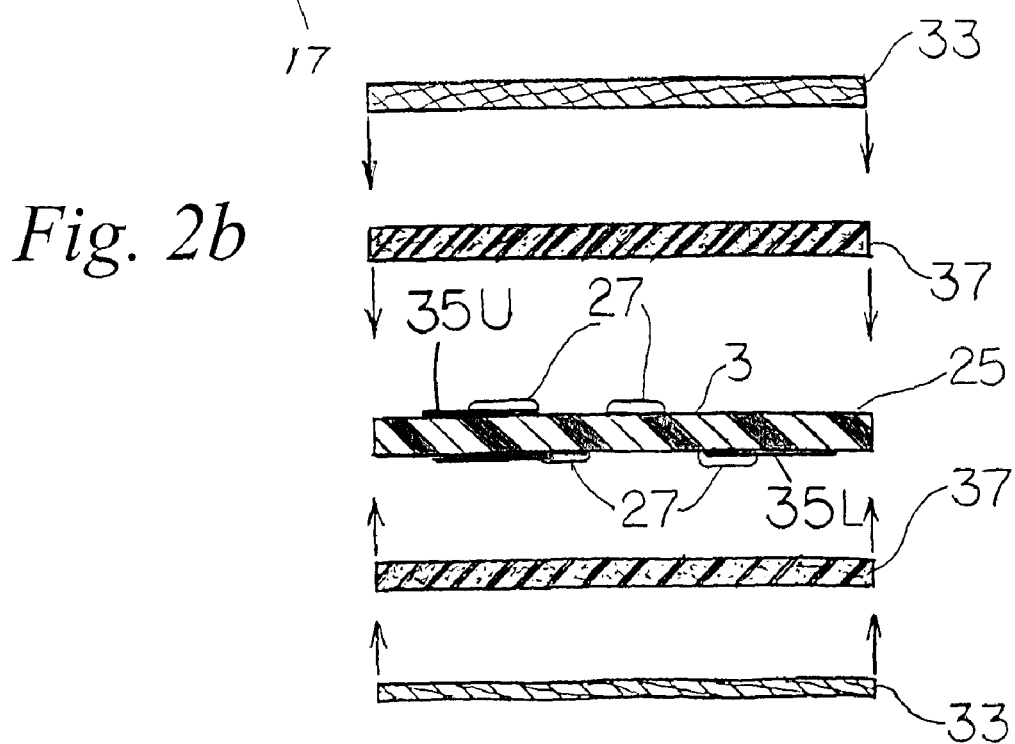
FIG. 2b is an exploded view of an assembly as in FIG. 2 except that the circuit board is double sided with a foam layer on both sides and the backing plates are found both above and below the circuit board.

FIG. 2b is an exploded view of a double-sided PCB/circuit board 25 having surface mount components 27 on both upper and lower faces and the assembly includes resilient foam layers 37 and top and bottom clamp boards 33. The surface-mounted complements 27 contact conducting traces 35U and 35L, respectively. It will be recognized that this assembly will be held together in the same manner as is illustrated in FIG. 2.

Figure 2C:
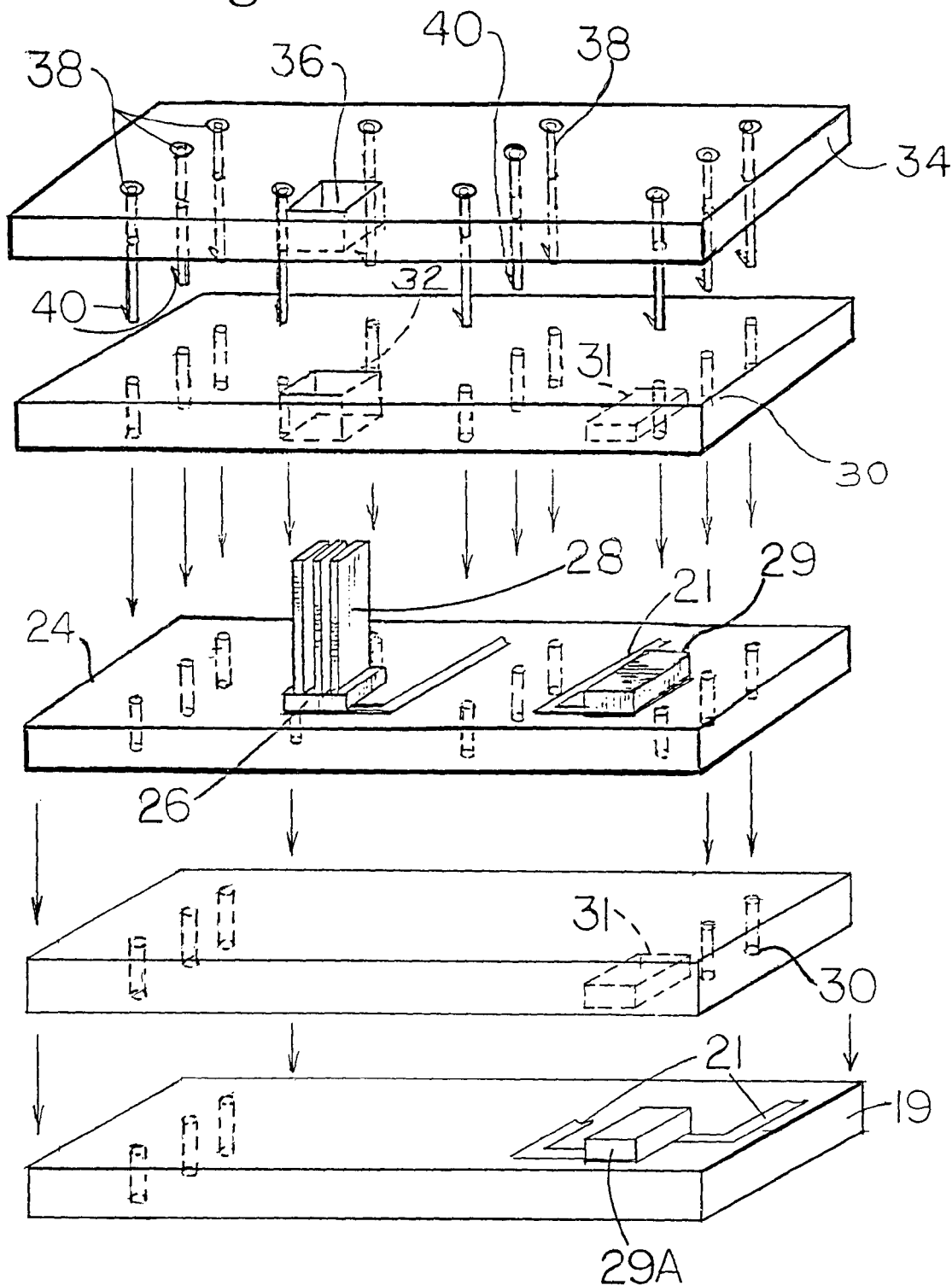
FIG. 2c is a perspective view, exploded similar to FIG. 2 with two single sided stackable circuit boards.

FIG. 2c is an exploded perspective view of a circuit assembly similar to FIG. 2 but including two single surfaced PCB/circuit boards 24 and 19. The circuit board 19 acts also as a clamping board or sheet. The circuit board 24 is nested between two foam layers 30 and includes a surface mount component 26, which requires a heat sink/radiator 28. The upper foam layer 30 and the upper clamping board 34 each include clearance openings for the heat sink/radiator 28. This embodiment demonstrates that this invention is compatible with use for heat radiating circuits.

The assembled circuit of FIG. 2 is also shown in FIG. 3, which is a side view of the device of FIG. 2, partly broken away to show some internal structure. Shown are component 26 with heat sink 28 and the second surface-mounted component 29, which is encased in a cavity 31 in foam layer 30 that tightly surrounds it. Connecting pins 38 are shown extending through foam layer 30 and PCB/circuit board 24. Printed circuit tracks 12 are shown in fragmentary form.

FIG. 3a is an enlarged view of the circled part A of FIG. 3 showing the end of a connecting pin 38 and barbs 40 that effectively hook under PCB/circuit board 24. A series of such pins 38 and barbs 40 hold the circuit together against the resilient force of foam layer 30.

FIG. 3b is an enlarged view of a circled portion B of FIG. 3 showing surface-mount component 26, heat sink 28, foam layer 30, clamping sheet or board 34, and PCB/circuit board 24. Conductor tracks 12 are shown on the surface of PCB/circuit board 24 and a surface mount conductive pad portions 44 and 46 are shown pressed against tracks 12 to make an electrical connection between component 26 and tracks 12 without any solder.

FIG. 3c is a fragmentary view of an alternative form of clamping sheet 34, given numeral 34a, and connecting pin 38a. By processes such as injection molding, the sheet 34a may be of molded plastic and with connecting pin 38a integrally molded at the same time. Members 34a and 38a could also be formed in a coating process, as by machining.

Now referring to FIGS. 4a-6 wherein FIG. 4 is a side elevational view of a printed circuit board 45 having a spring switch 46 mounted thereon. Switch 46 includes a coil spring 49 and an integral clamp 50, which clamps to circuit board 45 and holds coil spring 49 in a normal, at rest, position where it does not normally contact a printed circuit track 54.

Figure 6:
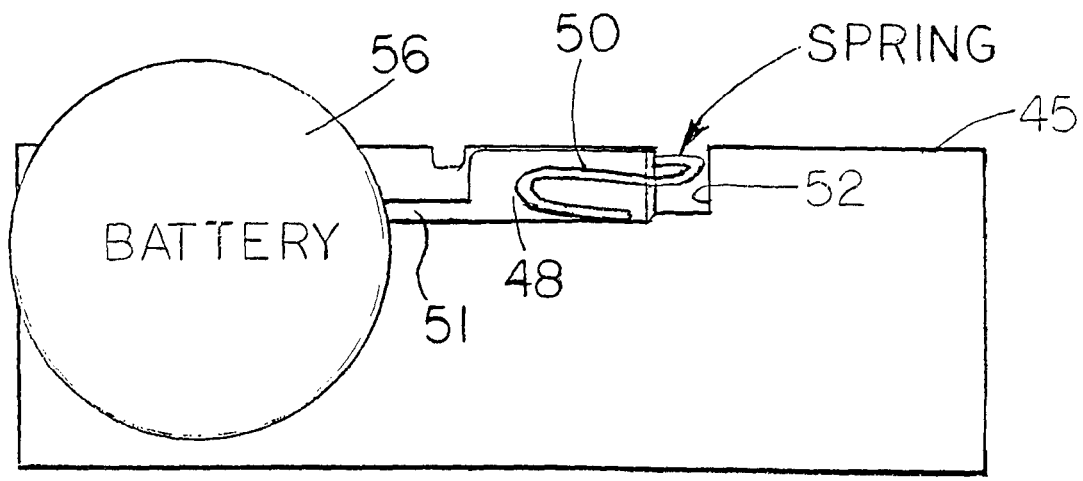
FIG. 6 is a bottom view of the circuit board and spring switch of FIGS. 4 and 5 with a partial conductive trace showing.

FIG. 4b is a perspective view of spring switch 46 mounted on circuit board 45, including coil spring 49 and an integral clamp 50 which is formed to reach through a slot 52 in the circuit board 45 to hold spring switch 46 in position and to make and break electrical contact with a printed circuit track 54 on the top surface of PCB/circuit board 45 from a pad 48 on the underside as shown in FIG. 6. This integral clamp 50 serves both to mechanically hold spring switch 46 in position on PCB/circuit board 45 and to make electrical contact with a conductor pad 48 on the lower side of board 45 (FIG. 6). The distal end of coil spring 49 is shown in FIG. 4a in contact with conductor track 54 on the surface of circuit board 45. This spring switch 46 will be normally open, as illustrated in FIG. 4, with coil spring 49 spaced away from conductor track 54 and will respond to shock or vibration to vibrate against track 54, thereby providing a series of closely timed circuit closings. A particular use for such a spring switch 46 is to operate battery powered flashing LEDs in clothing, such as footwear. This switch 46 does not require any solder connection, in contrast with prior art assemblies for similar uses.

Figure 5:
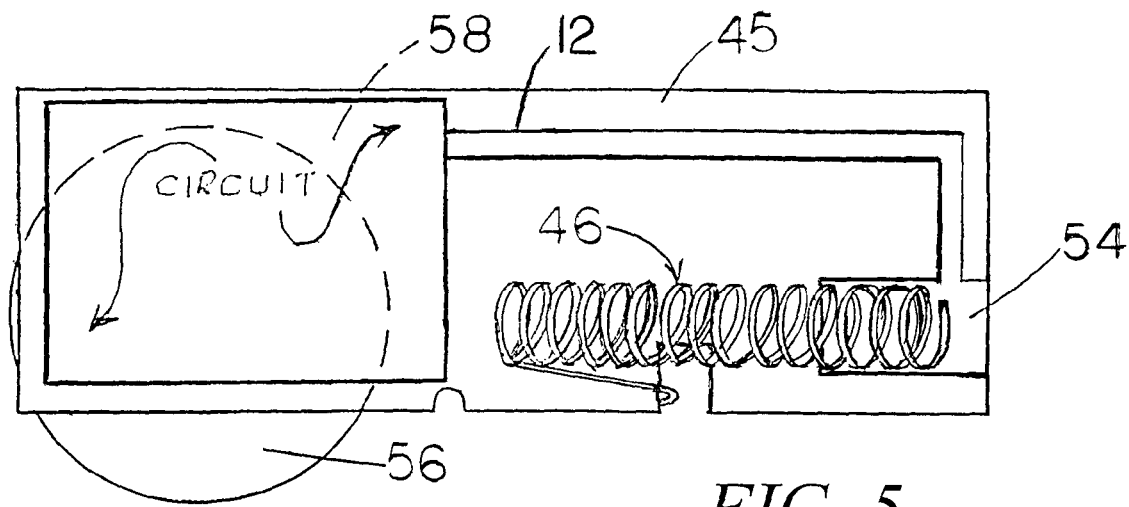
FIG. 5 is a top plan view of the spring switch and circuit board with an integrated circuit and a conductive trace.

FIG. 5 is a plan view of the PCB/circuit board 45 with the spring switch 46 in its at-rest OPEN position shown above but not contacting conductor track 54. A disc-shaped battery 56 is shown, partly in dashed line, attached to the lower side of PCB/circuit board 45, and an integrated circuit 58 is shown in solid outline on the top side of circuit board 45 and connected to switch 46 by a printed circuit track 12. Circuit 58 may be protected by potting compound with the switch 46 protected as is illustrated in FIGS. 7 and 8.

FIG. 6 shows PCB/circuit board 45, as seen from the bottom including battery 56 and the clamping portion 50 of spring switch 46, which clamps against conductor pad 48. Pad 48 is connected to battery 56 through a conductor track 51.

Figure 7:
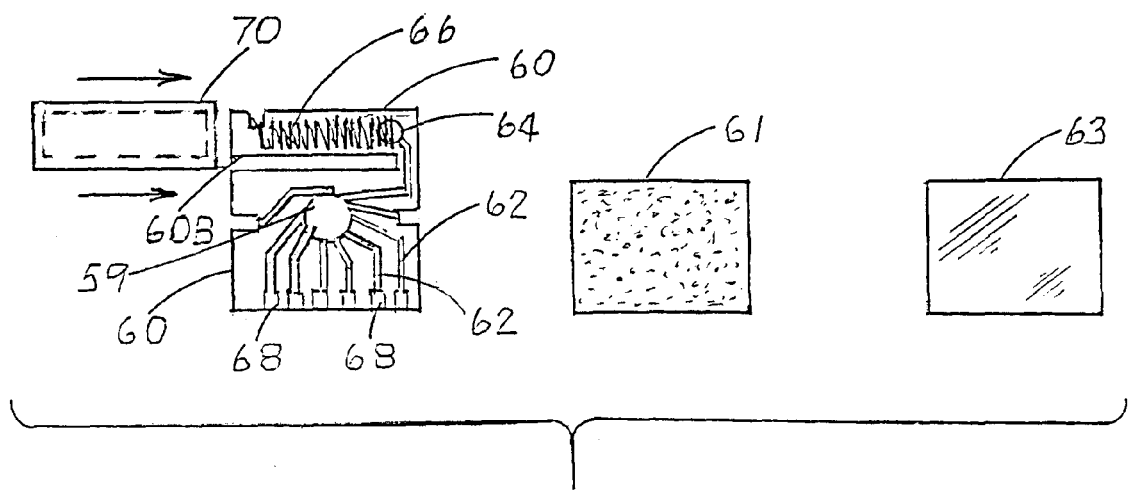
FIG. 7 is an exploded top plan view of a printed circuit board including a battery and a spring switch like that of FIGS. 4, 5, and 6 having a cover.
Figure 8:
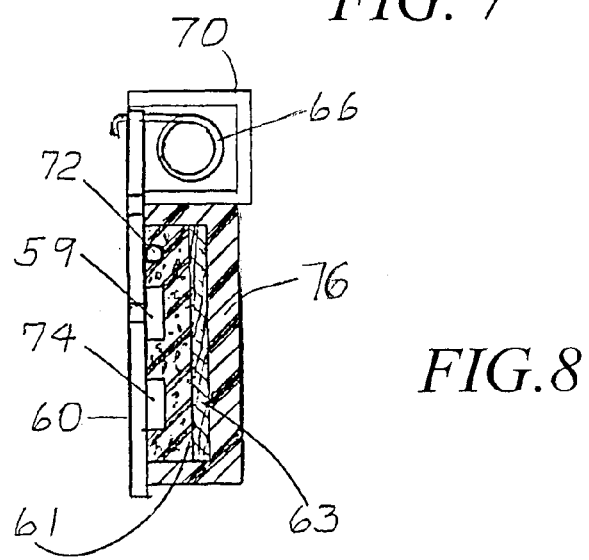
FIG. 8 is a left side view, partly in section, of the assembled printed circuit board of FIG. 7 including resin potting material over the printed circuit and a cover over the spring switch.

FIG. 7 is a top plan view of a printed circuit board 60 including an integrated circuit 59, a spring switch 66, and a cover 70 for the spring switch. PCB/circuit board 60 supports include a number of conductor tracks 62. One of the tracks 62 extends to a conductive pad 64 located near the end of spring switch 66, the opposite end of which is formed as a clamp as described above that makes contact with a conductive track on the same side or the lower side of PCB/circuit board 60. A number of conductor tracks 62 terminate in conductive pads

68, which are connected to wires or other components such as LEDs, not shown, by means of clamps or connecting devices described below. Foam pad 61 and clamp board 63 are shown side by side with circuit board 60.

FIG. 8 is a left side view, partly in section, of PCB/circuit board 60. Various components, including surface-mount components, may be positioned on the surface of PCB/circuit board 60 and these may be held in place by a resilient foam layer 61 and a clamping sheet 63, as described above. To make all electrical connections secure, even in spite of much moving and jarring of PCB/circuit board 60, PCB/circuit board 60, its components, foam layer 61, and clamping sheet or board 63 are preferably immersed in potting resin 76 and a cover 70 is provided to cover spring switch 66 to prevent the potting resin 76 from reaching switch 66 during manufacture. This cover 70, which could be in the form of a plastic box with a top, two sides and two ends, is designed to snap over the edges 60A and 60B to allow the switch 66 freedom to operate and to protect spring switch 66 from contact with potting resin.

In this view, integrated circuit 59 is shown, and additional components 72 and 74, which are surface-mount components, are held in position against board 60 by means of a foam layer 61 and clamping sheet 63. Cover 70 is shown surrounding spring switch 66. The entire circuit board 60, except for spring switch 66 and cover 70, is enclosed in potting compound 76.

Figure 9:
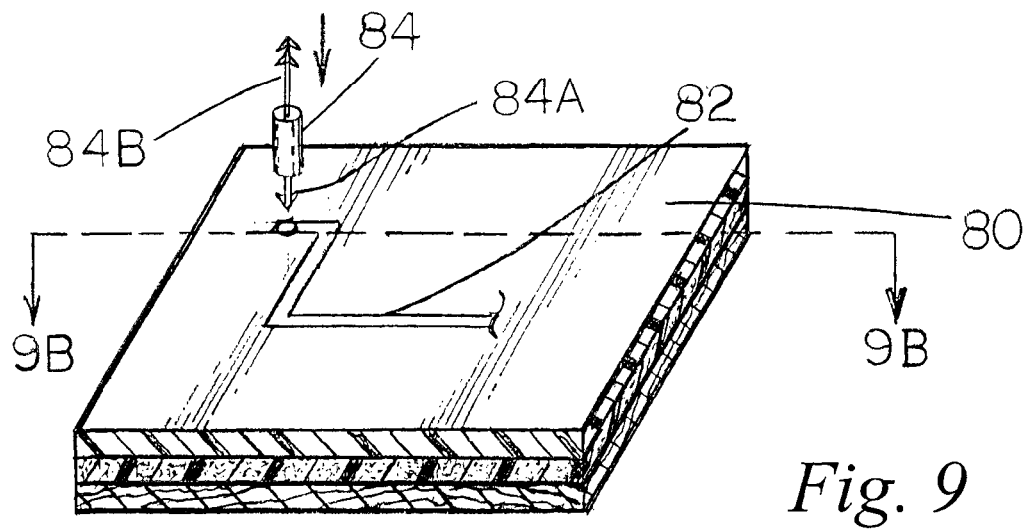
FIG. 9 is a fragmentary perspective view of a printed circuit board with a leaded component having a barbed lead being connected to a conductor track.
Figure 9A:
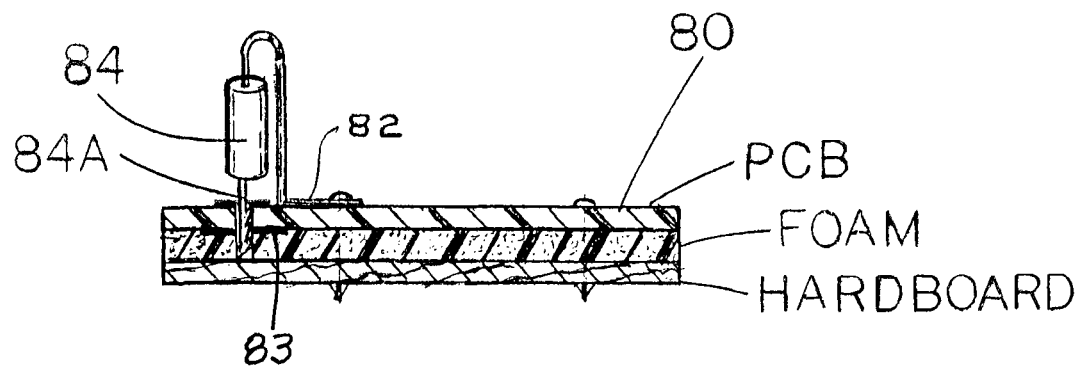
FIG. 9a is a sectional view taken along line 9b-9b of FIG. 9a when the component of FIG. 9 is assembled.

FIG. 9a is a sectional view of circuit board 80 taken along line 9a-9a of FIG. 9a showing foam layer and clamping sheet. Lead 84A can also make an electrical connection with a conductor track 83 on the opposite side of circuit board 80. Thus, barbs on lead 84a engage conductor tracks 82 and 83 on the upper and/or bottom surface of the PCB/circuit board 80 and on the wall of the hole if plated as shown in FIG. 9a. Applicant has found that such solder and lead (Pb) free connections make good contact and, if secured as described above, retain good contact despite a substantial amount of vibration or bumping in its normal operational use. The component 84 would normally lie on its side with its leads bent and possibly covered with a conformal covering.

Figure 10:
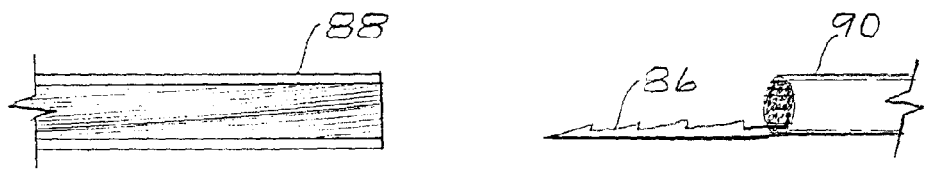
FIG. 10 is a side elevational view of a barbed section of wire connector for connecting two insulated wires together.

FIG. 10 is a side elevational view, partially in section, of a short length of barbed connector 86, which is wire sharpened and barbed at both ends, but barbed along one edge only, to function as a splice between two lengths of insulated wire 88, 90.

Figure 10A:
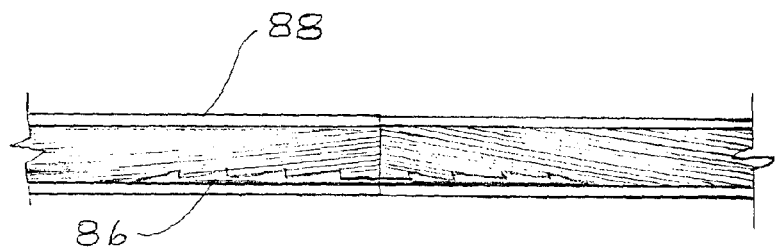
FIG. 10a is a sectional view showing the wire connector of FIG. 10 inserted in a pair of insulated wires with a shrink sleeve in place over the joint.

As shown in FIG. 10a, connector wire 86 has been forced between each of wires 88, 90 and its insulation layer such that the barbs make contact with the metal in wires 88, 90, and electrical continuity is assured between wire 88 and wire 90. This is usable whether the conductors are single strand or stranded.

Figure 10B:
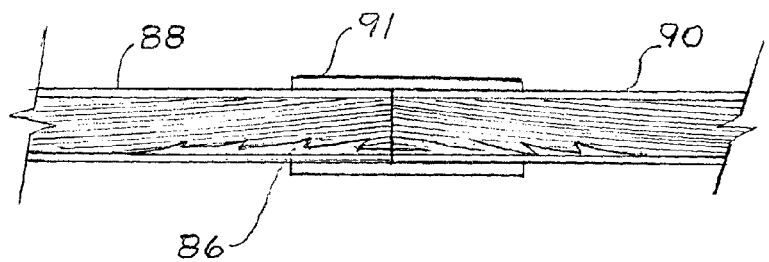
FIG. 10b is a sectional view of a pair of stranded insulated wires connected together with the wire connector of FIG. 10.

When the two wires are driven together, as shown in FIG. 10b, with the insulation ends in slightly compressed contact and then released a solder-free joint is accomplished. A turn or two of insulating tape 91 or fusing the insulation together or a shrink-fit plastic sleeve will seal the joint permanently.

Figure 10C:
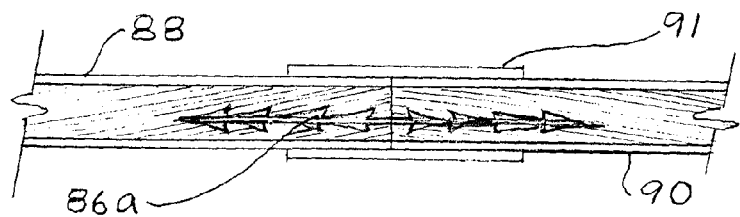
FIG. 10c is a sectional view of a modified barbed wire connector connecting a pair of insulated wires.

FIG. 10c is a sectional view similar to FIG. 10b but wherein the connector 86a has barbs along two edges of the wire and is forced into the center of the stranded wires 88 and 90. It will be recognized that the barbs shown in FIGS. 10-10c are exaggerated in size for clarity.

Figure 10D:
FIGS. 10d-10g are side elevational views of alternate forms of wire connectors with serrated sharp engagement surfaces.
Figure 10E:
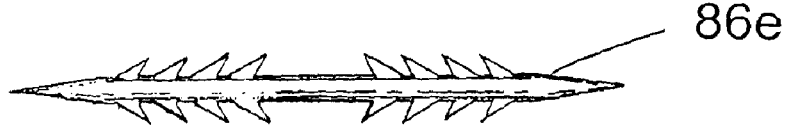
Figure 10F:
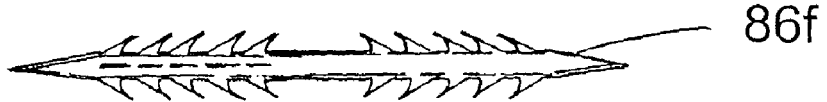
Figure 10G:

FIGS. 10d, 10e, 10f, and 10g are plan views of other wire connectors similar to connector 86. In FIG. 10d, the connector 86a has reversed spiral barbs; in FIG. 10e, dual opposite barbs are present; in FIG. 10e, dual opposite barbs are used; in FIG. 10f, reversed fishhook barbs are shown; and in FIG. 10g, reverse sharpened discs are disclosed. Each design is capable of providing effective low resistance permanent but changeable connections without solder.

FIG. 11 is a top plan view of a three-way splice with a Y-shaped wire 92 having points at all three ends 93, 94, 96 and barbs on one side of each end, as with FIG. 10. Wire 92 can connect three or more wires or combinations of wire connections as shown in FIG. 10 and/or connections with one or more PCB/circuit boards, as shown in FIG. 9.

FIG. 12 is a perspective view of a LED 98 having leads 100, 102, both of which are shown with pointed ends and barbs on one side of each lead. Lead 100 is shown about to be inserted between the wire and the insulation of an insulated lead 104. Lead 102 could also be inserted into a second wire or a PCB/circuit board as shown and described in connection with FIG. 9. Effective, reliable connections are made without solder or crimping. They may be intentionally separated and rejoined at will and still maintain good electrical conductivity and life.

FIG. 12a is a side elevational view of a transistor 97 having barbed and sharpened leads.

FIGS. 12b, 12c, 12d, 12e, and 12f are perspective view of an integrated circuit 99, a switch 101, a potentiometer 103, a transducer 105, and a motor 107, respectively, all of which have sharpened and barbed leads.

FIG. 13 is a top plan view of an electrical component 106, which could be a resistor or capacitor having wire leads 108 and 110 extending from its opposite ends. It will be noted that the leads 108 and 110 are barbed along two sides.

FIG. 14 is an enlarged view of the end of one of leads 108 or 110 showing the double barbed lead ends. Such double-barbed leads are particularly useful for making connections to printed circuit conductor tracks, and particularly to conductor pads forming part of conductor tracks on PCB/circuit boards and to plated through holes in circuit boards.

Figure 15:
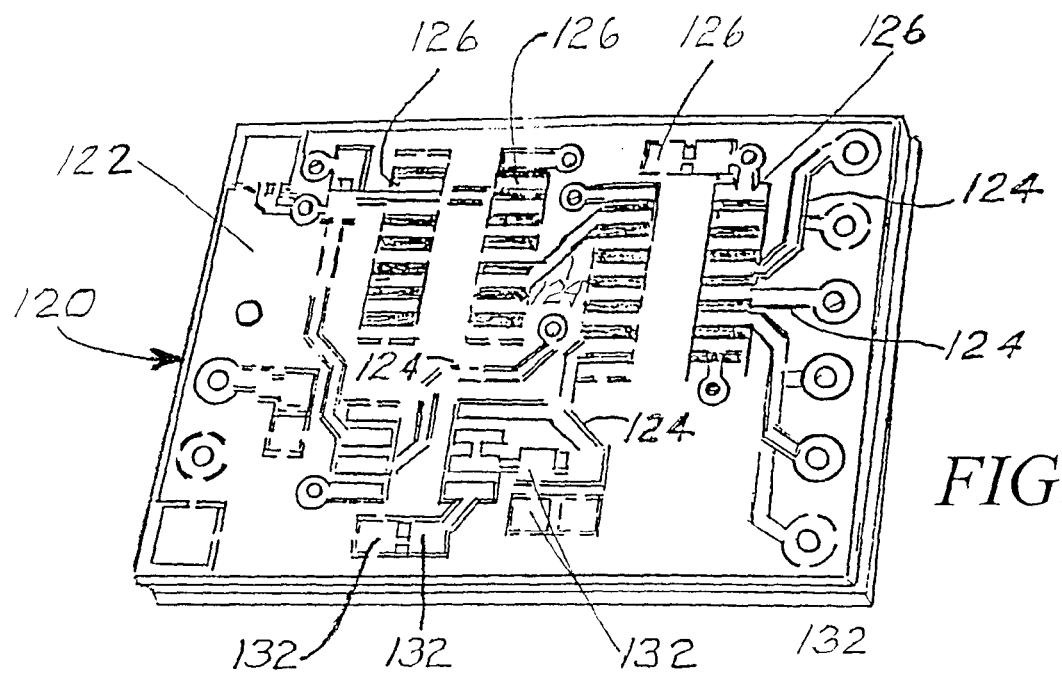
FIG. 15 is a perspective view of a printed circuit board usable in this invention designed to receive two integrated circuits plus other electrical components.
Figure 16:
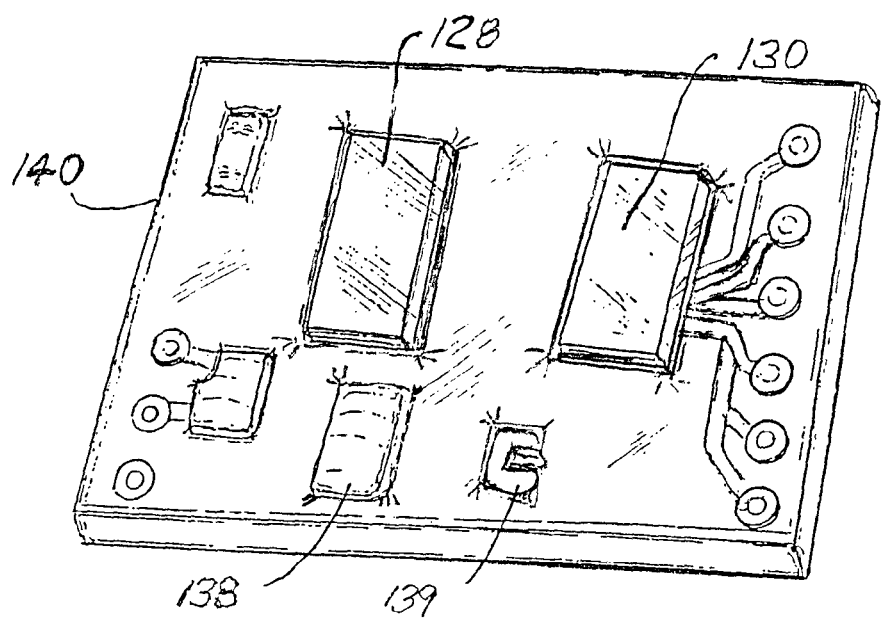
FIG. 16 is a perspective view of a printed circuit in which an alternate form of resilient material is utilized to apply contact pressure in accordance with this invention.

FIGS. 15-18 show an alternate embodiment of this invention. In FIG. 15, a more complex printed circuit board generally designated 120 is shown with a conductive surface 122 etched to define a plurality of conductive tracks all designated 124 and a plurality of pads, all designated 126, placed to make electrical contact with the pair of integrated circuits (not shown in FIG. 15) but appearing in FIG. 16 as circuits 128 and 130. The pads 132 in FIG. 15 are positioned to receive discrete components 138 and 139, which appear in FIGS. 16-18. Of course, the layout for each printed circuit can be different. The commonality with earlier embodiments resides in the use of a printed circuit board 120, the conducting surface 122 and the flexible insulating cover 140 shown only in FIGS. 16-18, together with a compression cover 142 of FIG. 17.

This cover 140 is made of the sheet form, electrically insulating, and preferably transparent material, such as polyvinyl chloride, which has been compression molded or vacuum formed over a layout of each of the components to be inserted onto the printed circuit board 120 in their respective positions. Cover 140 is preferably vacuum-formed over the components in their appropriate position on a mockup to conform its shape to the circuit assembly. Thereafter, the flexible sheet 140 acts as a placement jig when inverted and filled with components, each in their proper position so that the printed circuit board can be placed over it and each one of the components is automatically put in place. If desired, adhesive can be placed in the cavities or pockets of sheet 140 to hold the components in their proper cavities during assembly.

Figure 17:
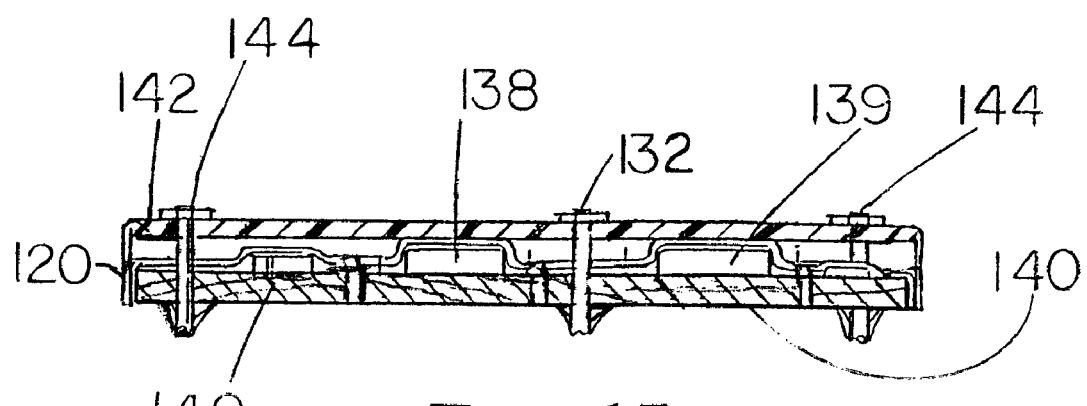
FIG. 17 is a transverse sectional view of an electronic circuit or module using the circuit board and resilient material of FIGS. 15 and 16 in combination with a clamping board like that of FIG. 2.

The compression cover 142, shown only in FIG. 17, bears against the highest points of the formed sheet 140 and is secured in place by fastener means such as barbed end rivets 144. This embodiment of the invention is particularly suited to automated production using preformed flexible sheets 140 upon which the components or integrated circuits to be assembled are placed in their appropriate cavities, and then the printed circuit board is placed on top. During this assembly process, the combination is inverted when compared with FIG. 17.

If a higher degree of compression other than that provided by the sheet 140 is needed, an additional foam layer, such as layer 30 of FIGS. 1 and 3 may be placed between the flexible sheet 140 and the compression cover 142.

Figure 18:
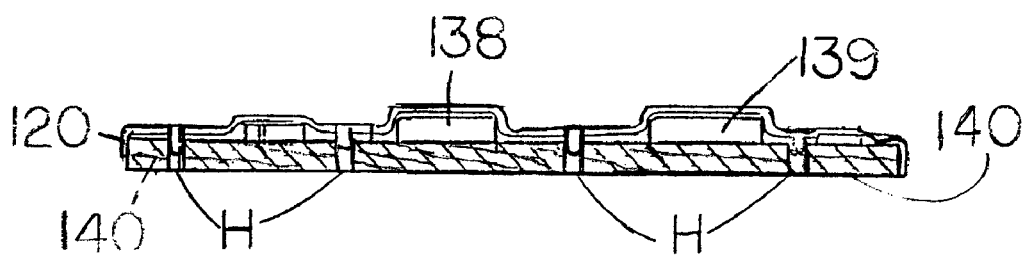
FIG. 18 is a transverse sectional view of an electronic circuit or module similar to FIG. 17 but with the clamping board deleted.

As shown in FIG. 18, the assembly of FIG. 17, without compression cover 142, can be sealed at the edges of sheet 140 against the PCB/circuit board 120 and air between cover 140 and PCB/circuit board 120 extracted to create a vacuum securely holding cover 140 and the internal components in place. The cover 140 can be drawn by the vacuum into holes H of the circuit board 120 to provide secure compression induced contact of the circuit components to the circuit tracks.

Figure 19:
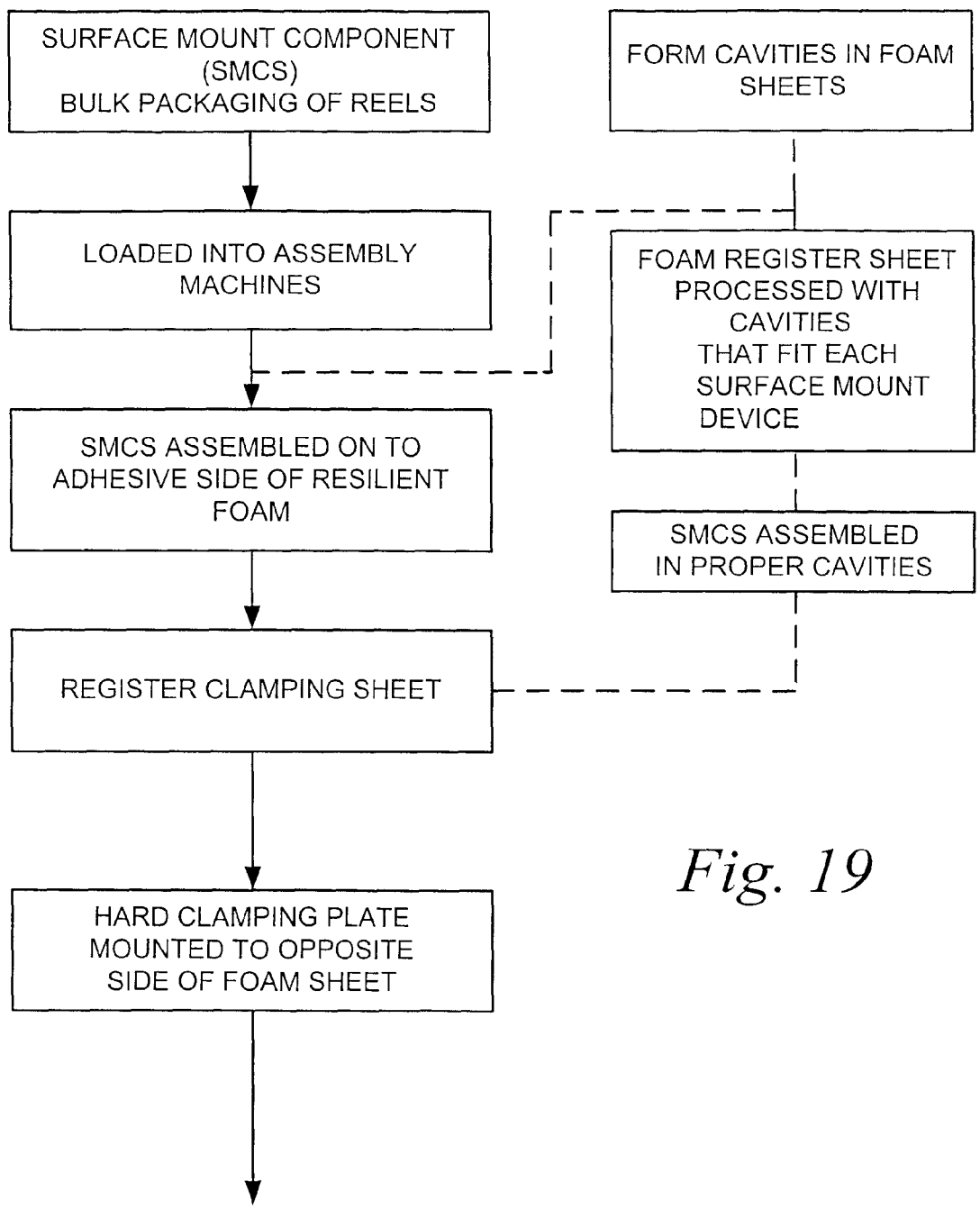
FIGS. 19 and 20 constitute a flow diagram of the method or process of this invention.
Figure 20:
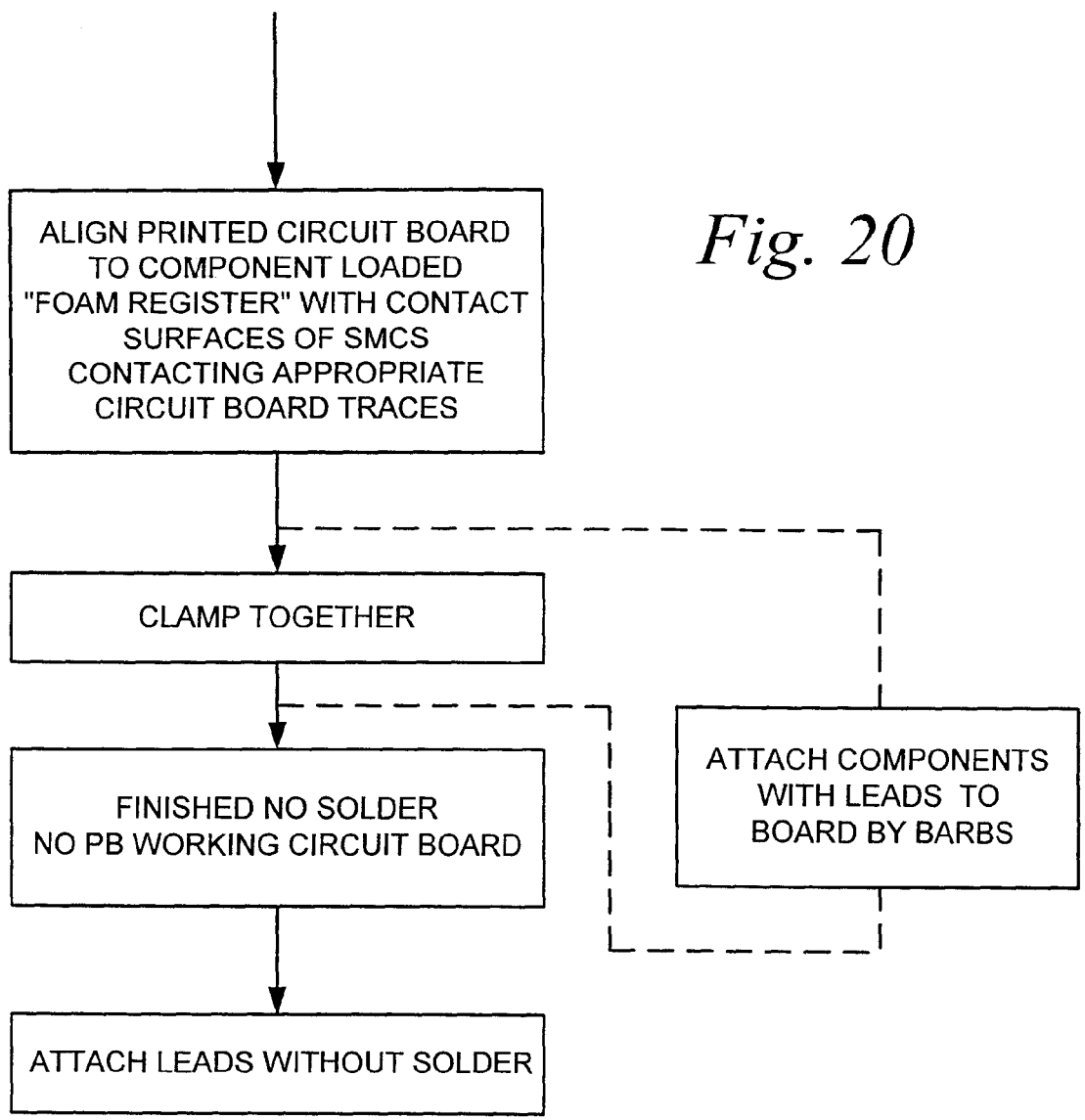

Improved solder-free circuits or modules are produced in accordance with the process illustrated in the flow diagram of FIGS. 19 and 20.

Figure 21:
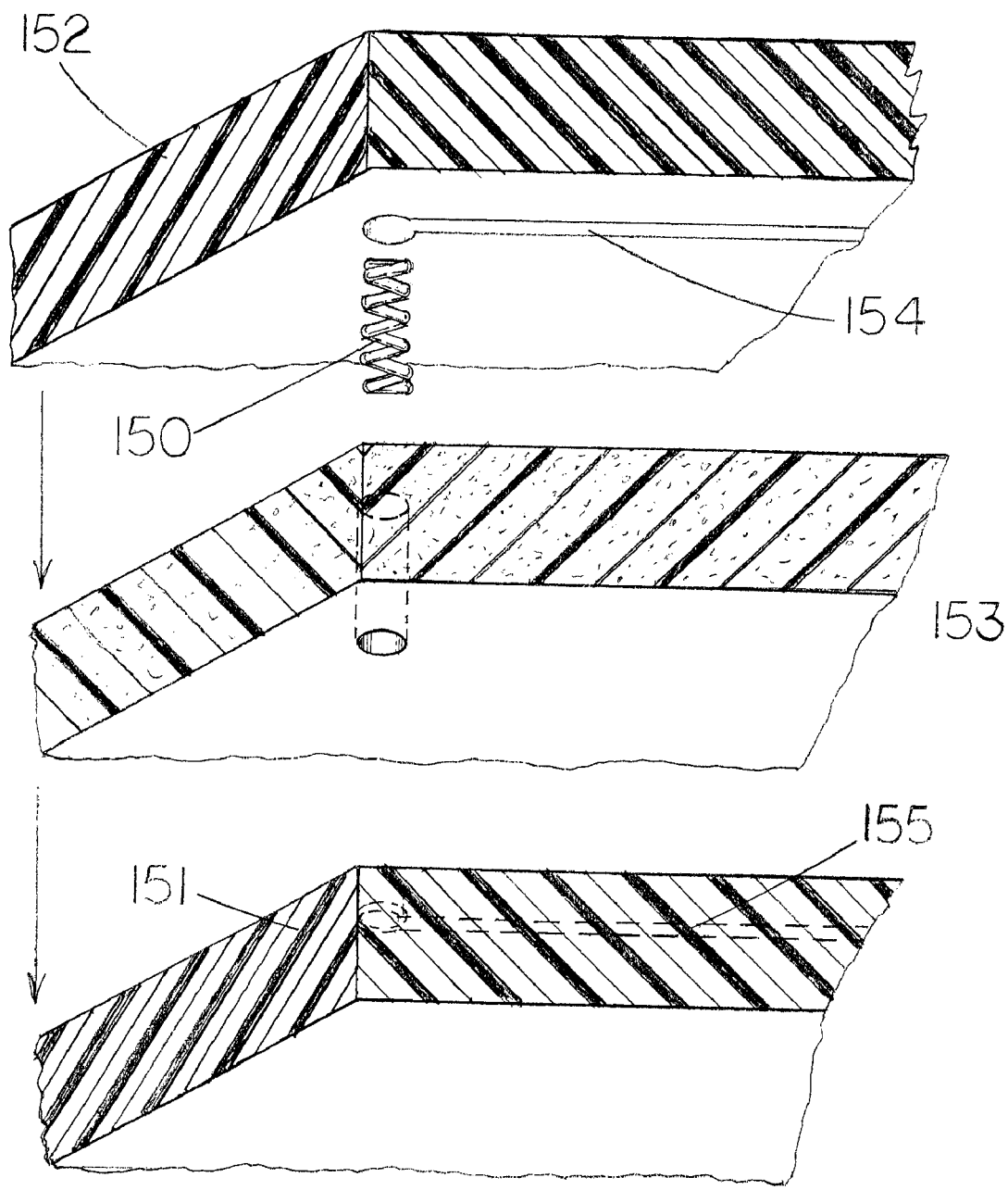
FIG. 21 is a fragmentary exploded circuit assembly with helical springs used as the connectors between circuit board traces on facing circuit boards and the spring contact extending through holes in a resilient foam sheet.

FIG. 21 illustrates in fragmentary exploded form that a simple conductive helical spring 150 can constitute an effective electrical connector between stacked, foam spaced PCB/circuit boards in miniature electronic circuits. Each spring 150 extends through a respective through hole in the resilient foam pad 153 to engage conductive traces 154 of board 152 and trace 155 on board 151 and provide a reliable inter-circuit connection. The rear or outer faces of the circuit boards 151 and 152 can act as the clamp boards for the assemblies. Since no lead (PB) or solder is used and no through-the-board leads are present, the circuit boards 151 and 152, when secured together by fasteners such as those shown in FIGS. 2, 3, 3a and 3b, the circuit boards 151 and 152, themselves can provide this clamping surface with no part of the electronic circuit exposed except for any wanted exterior connections. Encapsulation can further protect the circuit from environmental contamination.

As used herein, the term "electronic circuit" shall include some form of support which may include interconnecting wires or conduction traces, components, electrical electronic, or electro-mechanical which are interconnected electronically as required to perform a useful function. The circuit may include a protective housing an external connections and internal batteries.

As used herein, the term "module" may also be used.

The above-described embodiments of the present invention are merely descriptive of its principles and are not to be considered limiting. The scope of the present invention instead shall be determined from the scope of the following claims including their equivalents.

What is claimed is:

1. An electronic circuit, comprising: a circuit board having conducting tracks; at least one electronic component having a top surface, a bottom surface and conducting contacts positioned overlying portions of the conducting tracks; and a clamp that covers and is in contact with the top surface; wherein said contact between the clamp and the top surface of the electrical component holds the conducting contacts in electrical contact with the conducting tracks; and wherein the conducting tracks are in electrical contact with the bottom surface of the component, wherein the clamp is further comprised of a resilient layer held between the top surface and the clamping sheet;
   wherein the at least one fastener is comprised of a plurality of barbed pins which penetrate the resilient layer and the circuit board with the barbs of said plurality of barbed pins securing contact with the circuit board.

2. The electronic circuit of claim 1, wherein the electrical contact between the conducting tracks and the bottom surface of the component is maintained in the absence of any solder.

3. The electronic circuit of claim 2, wherein the clamp is comprised of:
   a clamping sheet; and
   at least one fastener that secures the clamping sheet to the circuit board.

4. The electronic circuit of claim 1, wherein the clamping sheet is rigid.

5. The electronic circuit of claim 2, further comprising a first insulated electrical interconnecting lead in the circuit and connected thereto a second insulated electrical interconnecting lead connected to the circuit, each of the first and second insulated electrical interconnecting leads having an end with an exposed conductor within an insulating covering and a wire splice member extending within the insulating covering of both leads thereby electrically interconnecting said insulated leads.

6. The electronic circuit of claim 1, wherein the resilient layer has at least one cavity in an underside of the resilient layer corresponding in shape with the at least one electronic component.

7. The electronic circuit of claim 6, wherein the at least one electronic component has at least one barbed lead which is forced into electrical contact and barbed mechanical engagement with at least one of the conducting tracks to provide electrical and mechanical engagement between said component and said at least one of the conducting tracks.

8. The electronic circuit of claim 7, further comprising at least one insulated electrically conducting wire connected to the circuit made by a barbed connector wire end forced between an insulating covering and a conducting wire of the at least one insulated electrically conducting wire.

9. The electronic circuit of claim 1, wherein the clamping sheet comprises a plastic sheet vacuum formed to conform its shape to the at least one electronic component and to force said at least one electronic component against the conducting tracks.

10. The electronic circuit of claim 1, further comprising:
    a heat sink thermally connected to at least one electronic component; and
    ventilation ports formed in the clamping sheet and the resilient layer for ventilating the heat sink.

11. An electronic circuit, comprising: a circuit board having a plurality of conductor tracks; a plurality of electronic components, each of which has a top surface, a bottom surface and conducting contacts positioned overlying portions of a component set of conductor tracks of the plurality of conducting tracks; a layer of resilient foam insulating material covering the circuit board and the top surface of the plurality of electronic components; and a substantially rigid clamp overlying the resilient foam insulating material and secured to the circuit board such that the resilient foam insulating material contacts the top surface of each of the plurality of electronic components and thereby forces each of the plurality of electronic components against its component set of conductor tracks, wherein at least one of the plurality of electronic components includes a sharp barbed lead which is forced into electrical and mechanical engagement with one of its component set of conductor tracks to provide an electrical connection.

12. The electronic circuit of claim 11, wherein insulated wires are connected to the circuit and at least some of said connections are made by sharpened barbed connecting wires forced between an insulating cover and a metal wire of the insulated wires.

13. The electronic circuit of claim 11, wherein the layer of resilient foam insulating material includes at least one recess corresponding in shape with at least one of the plurality of electronic components.

14. The electronic circuit of claim 11, further comprising:
a heat sink thermally connected to at least one electronic component; and
ventilation ports formed in the clamp and the layer of resilient foam insulating material for ventilating the heat sink.

15. The electronic circuit of claim 11, wherein the circuit board includes at least one plated through opening therethrough and a barbed connector lead makes electrical and mechanical connection at said plated though opening of the circuit board.

16. The electronic circuit of claim 11, further comprising:
a plurality of barbed connecting pins secured to the clamping sheet, said plurality of barbed connecting pins extending through the layer of resilient foam insulating material and the circuit board and anchoring against a side of the circuit board opposite an opposite side of the circuit board in contact with the layer of resilient foam insulating material.

17. An electronic circuit, comprising: a circuit board having conducting tracks;
at least one electronic component having a top surface, a bottom surface and conducting contacts positioned overlying portions of the conducting tracks; and
a clamp that covers and is in contact with the top surface and applies a force to the top surface of the at least one electronic component to hold the conducting contacts in electrical contact with the conducting tracks;
wherein the conducting tracks are in electrical contact with the bottom surface of the component and electrical contact between the conducting tracks and the bottom surface is maintained in the absence of any solder; and
wherein the clamp is comprised of a rigid clamping sheet and at least one fastener that secures the clamping sheet to the circuit board.

* * * * *